(12) United States Patent
Paek et al.

(10) Patent No.: US 8,129,260 B2
(45) Date of Patent: Mar. 6, 2012

(54) SEMICONDUCTOR SUBSTRATES HAVING LOW DEFECTS AND METHODS OF MANUFACTURING THE SAME

(75) Inventors: Ho-sun Paek, Yongin-si (KR);
Youn-joon Sung, Yongin-si (KR);
Kyoung-ho Ha, Yongin-si (KR);
Joong-kon Son, Yongin-si (KR);
Sung-nam Lee, Yongin-si (KR)

(73) Assignee: Samsung LED Co., Ltd., Gyeonggi-do (KR)

( * ) Notice: Subject to any disclaimer, the term of this patent is extended or adjusted under 35 U.S.C. 154(b) by 363 days.

(21) Appl. No.: 11/802,667

(22) Filed: May 24, 2007

(65) Prior Publication Data

US 2008/0020552 A1 Jan. 24, 2008

(30) Foreign Application Priority Data

Jul. 21, 2006 (KR) ........................ 10-2006-0068410

(51) Int. Cl.
*H01L 23/58* (2006.01)

(52) U.S. Cl. ............ 438/478; 257/13; 257/78; 257/102; 257/103; 257/631; 257/E21.108; 257/E21.132; 438/479; 438/492

(58) Field of Classification Search ............ 257/13, 257/103, 631, E33.002–E33.006, E33.043, 257/E21.119, E21.131; 438/478, 479, 492, 438/974, 503, 604
See application file for complete search history.

(56) References Cited

U.S. PATENT DOCUMENTS

| | | | |
|---|---|---|---|
| 5,387,541 A * | 2/1995 | Hodge et al. | 438/409 |
| 6,051,849 A | 4/2000 | Davis et al. | |
| 6,265,289 B1 | 7/2001 | Zheleva et al. | |
| 6,756,611 B2 * | 6/2004 | Kiyoku et al. | 257/103 |
| 2004/0038505 A1 * | 2/2004 | Ito et al. | 438/520 |
| 2004/0183090 A1 * | 9/2004 | Kitaoka et al. | 257/103 |
| 2006/0258027 A1 * | 11/2006 | Ohmae et al. | 438/22 |

OTHER PUBLICATIONS

European Search Report dated Dec. 23, 2009, issued in corresponding European Application No. 07101402.1-2203/1881522.
Kreinin, et al., "*Feasibility of Rapid Thermal MOCVD Growth for Fabrication of InP-Based Heterostructures*," International Conference on Indium Phosphide and Related Materials, pp. 401-404 (May 2001).

(Continued)

*Primary Examiner* — A. Sefer
*Assistant Examiner* — Ermias Woldegeorgis
(74) *Attorney, Agent, or Firm* — Harness, Dickey & Pierce, P.L.C.

(57) ABSTRACT

A semiconductor substrate includes a first semiconductor layer and a second semiconductor layer. The first semiconductor layer is formed of II-VI-group semiconductor material, III-V-group semiconductor material, or II-VI-group semiconductor material and III-V-group semiconductor material. At least one amorphous region and at least one crystalloid region are formed in the first semiconductor layer. The second semiconductor layer is formed on the first semiconductor layer and is crystal-grown from the at least one crystalloid region. A method of manufacturing a semiconductor substrate includes preparing a growth substrate; crystal-growing the first semiconductor layer on the growth substrate; forming the at least one amorphous region and the at least one crystalloid region in the first semiconductor layer; and forming a second semiconductor layer on the first semiconductor layer using the at least one amorphous region as a mask and the at least one crystalloid region as a seed.

20 Claims, 10 Drawing Sheets

OTHER PUBLICATIONS

Behres, et al., "*InP growth on ion-implanted InP substrate: a new method to achieve selective area MOVPE*," Journal of Crystal Growth 170, pp. 655-660 (Jan. 1997).

Sun, et al., "*Selective growth of InP on focused-ion-beam-modified GaAs surface by hydride vapor phase epitaxy*," Applied Physics Letters, vol. 79, No. 12, pp. 1885-1887 (Sep. 2001).

* cited by examiner

SEMICONDUCTOR SUBSTRATES HAVING LOW DEFECTS AND METHODS OF MANUFACTURING THE SAME

PRIORITY STATEMENT

This application claims priority from Korean Patent Application No. 10-2006-0068410, filed on Jul. 21, 2006, in the Korean Intellectual Property Office (KIPO), the entire contents of which are incorporated herein by reference.

BACKGROUND

1. Field

Example embodiments relate to semiconductor substrates and methods of manufacturing the same. Also, example embodiments relate to low-defect semiconductor substrates having low defect densities and an excellent surface morphology property and methods of manufacturing the same.

2. Description of Related Art

GaN is a wide bandgap semiconductor having a direct transition type bandgap of 3.39 eV and has been studied to be used in a variety of optoelectronic devices including blue light-emitting devices and protective thin films from the early 1970s. Since GaN has a continuous high solubility with a III-V-based nitride semiconductor such as InN or AlN, a trivalent nitride solid solution such as $In_xGa_{(1-x)}N$ or $Ga_xAl_{(1-x)}N$ can be formed. And, since a bandgap is changed into a primary function for composition according to the composition of a ternary nitride, by adjusting the composition of the III-V-based nitride semiconductor, a light-emitting device or a light-receiving device including all visible regions from a red wavelength region to a ultraviolet wavelength region can be manufactured.

Since such a GaN thin film may be used in a variety of fields, the importance of study and developing of growth of a GaN thin film and a device using the same has been recognized a long time ago and has proceeded. During this time, heteroepitaxy has been studied. In heteroepitaxy, a different kind of substrate, such as sapphire ($\alpha$-$Al_2O_3$), having large lattice mismatching and large thermal expansion coefficient mismatching with respect to GaN so as to grow a good GaN thin film and a GaN epitaxial layer, is grown using a buffer layer, such as AlN or GaN, so as to alleviate mismatching of lattice parameter and thermal expansion coefficient.

However, when GaN is grown on the different kind of substrate, a GaN or AlN buffer layer should be used at a low temperature of 500° C.-600° C. so as to alleviate lattice parameter and thermal expansion coefficient mismatching with respect to the substrate. As a result, an epitaxial growth process is complicated and the growth of various compounds such as InN or GaN required for manufacture of a light-emitting device may be not easily performed. In particular, due to differences between lattice parameter and thermal expansion coefficient, a GaN thin film grown on a sapphire substrate includes many lattice defects, that is, a dislocation density of about $10^9$ defects/cm². As a result, the performance of the manufactured light-emitting device may be degraded. However, the defect density of a GaN-based optoelectronic device, such as a light-emitting diode (LED) or laser diode (LD), should be low so as to increase a life time thereof and so as to improve reliability thereof. In the case of a traditional substrate having a low defect density, GaN is grown thick using halide or hydride vapor phase epitaxy (HVPE) growth and then is separated to be used as a GaN substrate. In this method, the GaN substrate does not have a sufficiently low defect density, nor is it easy to grow GaN sufficiently large to a size at which GaN can be used as a substrate. Thus, as a method of manufacturing a low-defect GaN thin film, a method for reducing a defect density by performing lateral growth has been spotlighted. Examples include epitaxial lateral overgrowth (ELOG) and Pendeo-epitaxy.

However, like ELOG, when a mask such as $SiO_2$ or $SiN_x$ is used, due to a difference in surface tension between a grown GaN thin film and the mask, crystals are tilted so that defects may be generated in a coalesced boundary of the GaN thin film. In this procedure, a groove may be formed on the surface of the GaN thin film and, thus, a surface morphology property may be deteriorated. Due to the insertion of a different kind of material such as $SiO_2$ or $SiN_x$, strain may be nonuniformly distributed in the GaN thin film. In addition, since thermal conductivity of $SiO_2$ is lower than that of GaN, thermal reliability of a device implemented on a mask region may be degraded. Accordingly, in order to address these problems, the development of a new technology for manufacturing a low-defect semiconductor substrate having a low defect density and an excellent surface morphology property is needed.

SUMMARY

Example embodiments may provide low-defect semiconductor substrates having low defect densities and an excellent surface morphology property and methods of manufacturing the same.

According to example embodiments, semiconductor substrates may include a first semiconductor layer and a second semiconductor layer. The first semiconductor layer may be formed of II-VI-group semiconductor material, III-V-group semiconductor material, or II-VI-group semiconductor material and III-V-group semiconductor material. At least one amorphous region may be formed in the first semiconductor layer. At least one crystalloid region may be formed in the first semiconductor layer. The second semiconductor layer may be formed on the first semiconductor layer. The second semiconductor layer may be crystal-grown from the at least one crystalloid region.

According to another example embodiment, methods of manufacturing semiconductor substrates may include: preparing a growth substrate; crystal-growing a first semiconductor layer on the growth substrate using II-VI-group semiconductor material, III-V-group semiconductor material, or II-VI-group semiconductor material and III-V-group semiconductor material; forming at least one amorphous region in the first semiconductor layer; forming at least one crystalloid region in the first semiconductor layer; and/or forming a second semiconductor layer on the first semiconductor layer using the at least one amorphous region as a mask and using the at least one crystalloid region as a seed. The second semiconductor layer may have a lower defect density than the first semiconductor layer.

According to yet another example embodiment, semiconductor light-emitting devices may include a first semiconductor layer, a second semiconductor layer, and/or a semiconductor chip. The first semiconductor layer may be formed of II-VI-group semiconductor material, III-V-group semiconductor material, or II-VI-group semiconductor material and III-V-group semiconductor material. At least one amorphous region may be formed in the first semiconductor layer. At least one crystalloid region may be formed in the first semiconductor layer. The second semiconductor layer may be formed on the first semiconductor layer. The second semiconductor layer may include at least one vertical growth region crystal-grown vertically from the at least one crystalloid region and/or at least one lateral growth region crystal-grown laterally from the at least one vertical growth region. The semiconductor chip may be formed on the second semiconductor layer. The semiconductor chip may include an n-type semiconductor layer, an active layer, and/or a p-type semiconductor layer. The n-type semiconductor layer, the active layer, and/or the p-type semiconductor layer may be sequentially stacked on the second semiconductor layer.

According to still another example embodiment, methods of manufacturing semiconductor light-emitting devices may include preparing a growth substrate; crystal-growing a first semiconductor layer on the growth substrate using II-VI-group semiconductor material, III-V-group semiconductor material, or II-VI-group semiconductor material and III-V-group semiconductor material; forming at least one amorphous region in the first semiconductor layer; forming at least one crystalloid region in the first semiconductor layer; forming a second semiconductor layer on the first semiconductor layer using the at least one amorphous region as a mask and using the at least one crystalloid region as a seed; and/or sequentially forming an n-type semiconductor layer, an active layer, and a p-type semiconductor layer on the second semiconductor layer. The second semiconductor layer may have a lower defect density than the first semiconductor layer. Forming the second semiconductor layer may include crystal-growing vertically, laterally, or vertically and laterally the at least one crystalloid region.

The forming of the at least one amorphous region and the at least one crystalloid region in the first semiconductor layer may include: forming a mask layer, comprising one or more patterns (such as a pattern or patterns of posts, a dot pattern or patterns, and/or a striped pattern or patterns) for partly exposing a top surface of the first semiconductor layer, on the first semiconductor layer; forming the at least one amorphous region by applying ion bombardment to an exposed top surface of the first semiconductor layer according to the pattern of the mask layer; and/or forming the at least one crystalloid region, through exposing the at least one crystalloid region that results from non-bombardment, by removing the mask layer.

A depth of greater than or equal to about 0.1 µm and less than or equal to about 4 µm may be etched from the exposed top surface of the first semiconductor layer by applying ion bombardment and at least one amorphous region may be formed in the first semiconductor layer on the etched surface.

According to example embodiments, a low-defect semiconductor substrate having a low defect density of greater than or equal to about $10^4$ defects/cm$^2$ and less than or equal to about $10^7$ defects/cm$^2$ and having an excellent surface morphology property can be manufactured by a simple and easy process.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Figure 1:
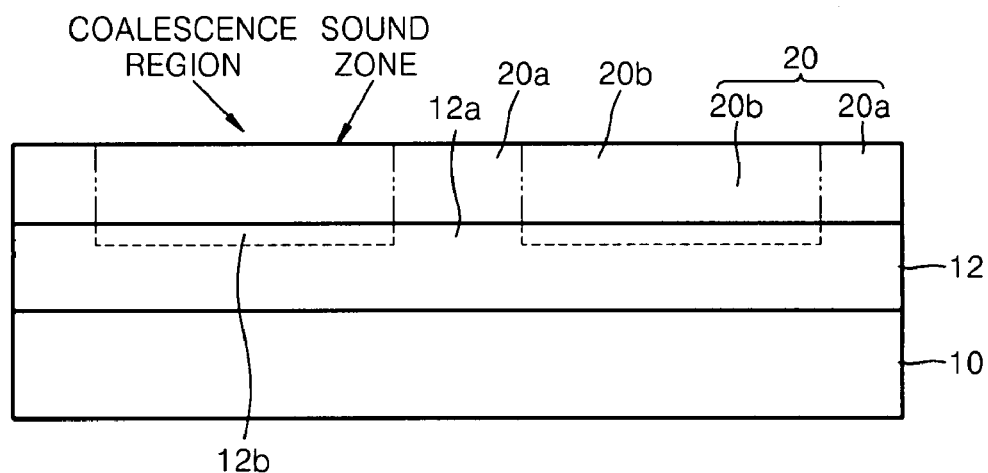
FIG. 1 is a schematic cross-sectional view of a semiconductor substrate according to an example embodiment.

Example embodiments will now be described more fully with reference to the accompanying drawings. Embodiments, however, may be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," or "coupled to" to another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element component, region, layer, and/or section from another element, component, region, layer, and/or section. For example, a first element, component, region, layer, and/or section could be termed a second element, component, region, layer, and/or section without departing from the teachings of the example embodiments.

Spatially relative terms, such as "beneath," "below," "lower," "above," "upper," and the like may be used herein for ease of description to describe one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 is a schematic cross-sectional view of a semiconductor substrate according to an example embodiment. Referring to FIG. 1, the semiconductor substrate may include a first semiconductor layer 12 and/or a second semiconductor layer 20 that are sequentially formed on the growth substrate 10.

The first semiconductor layer 12 may be formed of II-VI-group semiconductor material, III-V-group semiconductor material, or II-VI-group semiconductor material and III-V-group semiconductor material. An amorphous region 12b formed by ion-bombardment damage and/or a crystalloid region 12a that results from non-bombardment may be formed in the first semiconductor layer 12. At this time, the amorphous region 12b and the crystalloid region 12a may be repeatedly and/or alternately formed on the first semiconductor layer 12. And the second semiconductor layer 20 may include at least one vertical growth region 20a crystal-grown vertically from the at least one crystalloid region 12a and at least one lateral growth region 20b crystal-grown laterally from the at least one vertical growth region 20a.

Since the growth substrate 10 may include one or more of sapphire, 6H—SiC, $MgAl_2O_4$, Si(111), and ZnO, generally, the first semiconductor layer 12 formed on the different kind of growth substrate 10 may be formed to have a thickness greater than or equal to about 1 μm and less than or equal to about 5 μm and may include a defect density greater than or equal to about $10^8$ defects/$cm^2$ and less than or equal to about $10^{10}$ defects/$cm^2$. However, in the structure of the semiconductor substrate of FIG. 1, a defect density of the second semiconductor layer 20 epitaxially grown on the first semiconductor layer 12 may be greater than or equal to about $10^4$ defects/$cm^2$ and less than or equal to about $10^7$ defects/$cm^2$. In detail, the at least one crystalloid region 12a may be vertically, laterally, or vertically and laterally crystal-grown by, for example, metal organic chemical vapor deposition (MOCVD) using the at least one amorphous region 12b as one or more masks for suppressing crystal growth and using the at least one crystalloid region 12a as one or more seeds for crystal growth, thereby forming the second semiconductor layer 20, having a lower defect density than that of the first semiconductor layer 12, on the first semiconductor layer 12. Here, a defect density of the at least one vertical growth region 20a may be greater than or equal to about $10^8$ defects/$cm^2$ and less than or equal to about $10^{10}$ defects/$cm^2$ and a defect density of the at least one lateral growth region 20b may be greater than or equal to about $10^4$ defects/$cm^2$ and less than or equal to about $10^7$ defects/$cm^2$.

In this case, the second semiconductor layer 20 may be formed of material having the same lattice parameter and thermal expansion coefficient as that of material used in forming the first semiconductor layer 12 (or material having a sufficiently small difference in lattice parameter and thermal expansion coefficient from that of material used in forming the first semiconductor layer 12) so that epitaxial growth can be easily performed. For example, the second semiconductor layer 20 may be formed of II-VI-group semiconductor material, III-V-group semiconductor material, or II-VI-group semiconductor material and III-V-group semiconductor material, that may be the same material or materials used in forming the first semiconductor layer 12. Here, the II-VI-group semiconductor material may include, for example, ZnO and the III-V-group semiconductor material may include, for example, one or more of GaN, GaAs, and InP.

The width of the at least one amorphous region 12b may be greater than or equal to about 2 μm and less than or equal to about 30 μm, which is a value obtained by considering the efficiency of lateral growth using the seed. The second semiconductor layer 20 may be effectively epitaxially-grown within a width range greater than or equal to about 2 μm and less than or equal to about 30 μm in a short time. A thickness of the at least one amorphous region 12b may be greater than or equal to about 1 Å and less than or equal to about 5000 Å. The at least one amorphous region 12b should be thick enough to function as a mask for suppressing crystal growth, but does not need to be thicker than about 5000 Å. For a similar reason, when the thickness of the at least one amorphous region 12b is too small, that is, is less than about 1 Å, the at least one amorphous region 12b may not function as the mask. As a result, the thickness of the at least one amorphous region 12b should be greater than or equal to about 1 Å.

The width of the at least one crystalloid region 12a may be greater than or equal to about 1 μm and less than or equal to about 20 μm, which is a value obtained by considering a size suitable for serving as the seed for crystal growth. Here, since the amorphous region 12b and the crystalloid region 12a may be repeatedly and/or alternately formed on the first semiconductor layer 12, there is a correlation between the disposal and arrangement thereof, but many shape(s) and/or pattern(s) may be used. For example, the at least one crystalloid region 12a may be formed in a dot pattern or patterns, or in a substantially circular pattern. In addition, the at least one amorphous region 12b and the at least one crystalloid region 12a may be formed in a striped pattern or patterns. The striped pattern or patterns may be formed in or substantially in a <1-100> direction so that the lateral growth may be performed in or substantially in a <11-20> direction. As a result of the lateral growth, a coalescence region of the second semiconductor layer 20 may be formed on the at least one amorphous region 12b and a surface morphology property may be shown in the coalescence region. A sound zone shown in FIG. 1 denotes a low-defect density region that may be caused by the lateral growth.

According to example embodiments, since a mask made of a different material such as $SiO_2$ or $SiN_x$ in related art GaN growth using epitaxial lateral overgrowth (ELOG) or Pendeo-epitaxy is not used, but the at least one amorphous region 12b formed by ion-bombardment damage is used as a mask, strain may be uniformly distributed in the GaN thin film, that is, in the second semiconductor layer 20. In addition, since the thermal conductivity of the at least one amorphous region 12b is higher than that of $SiO_2$, the thermal reliability of an optoelectronic device, such as a light-emitting diode (LED) or a laser diode (LD), implemented on the at least one amorphous region 12b, may be improved.

FIGS. 2A through 2G illustrate a method of manufacturing a semiconductor substrate according to an example embodiment. Here, each material layer may be formed by halide or hydride vapor phase epitaxy (HVPE), metal organic chemical vapor deposition (MOCVD), molecular beam epitaxy (MBE), plasma enhanced chemical vapor deposition (PECVD), and/or vapor deposition, such as sputtering and/or evaporation.

Figure 2A:
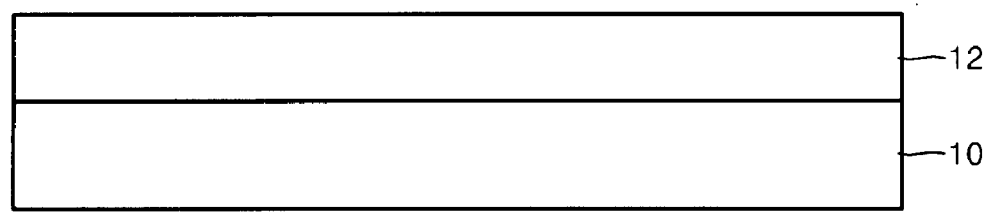
FIGS. 2A through 2G illustrate a method of manufacturing a semiconductor substrate according to an example embodiment.

Referring to FIG. 2A, a growth substrate 10 suitable for lattice matching for the growth of II-VI-group semiconductor layer(s) and/or III-V-group semiconductor layer(s) may be prepared. For example, the growth substrate 10 may include one or more of sapphire, 6H—SiC, $MgAl_2O_4$, Si(111), and ZnO. Next, a first semiconductor layer 12 is crystal-grown on the growth substrate 10 using II-VI-group semiconductor material, III-V-group semiconductor material, or II-VI-group semiconductor material and III-V-group semiconductor material. Here, the II-VI-group semiconductor material may include, for example, ZnO, and the III-V-group semiconductor material may include, for example, one or more of GaN, GaAs, and InP. The thickness of the first semiconductor layer 12 may be greater than or equal to about 1 μm and less than or equal to about 5 μm. And a defect density of the first semiconductor layer 12 grown on a different kind of the growth substrate 10 in this way may include a defect density greater than or equal to about $10^8$ defects/cm$^2$ and less than or equal to about $10^{10}$ defects/cm$^2$.

Figure 2B:
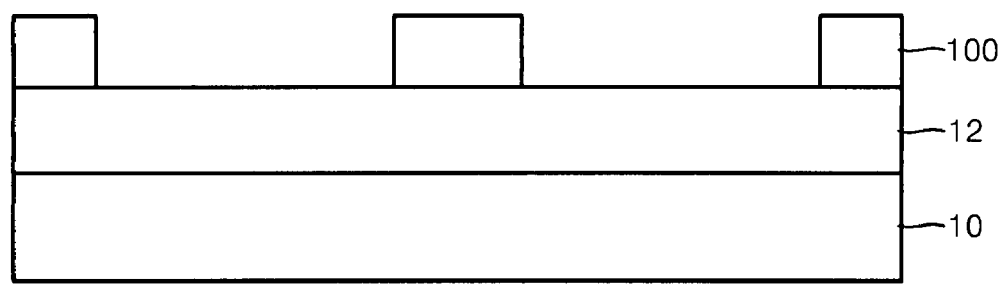
Figure 2C:
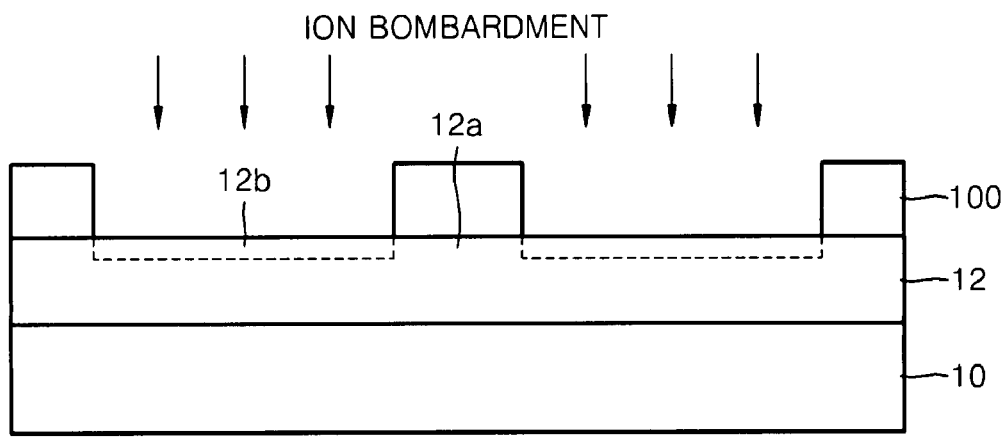
Figure 2D:
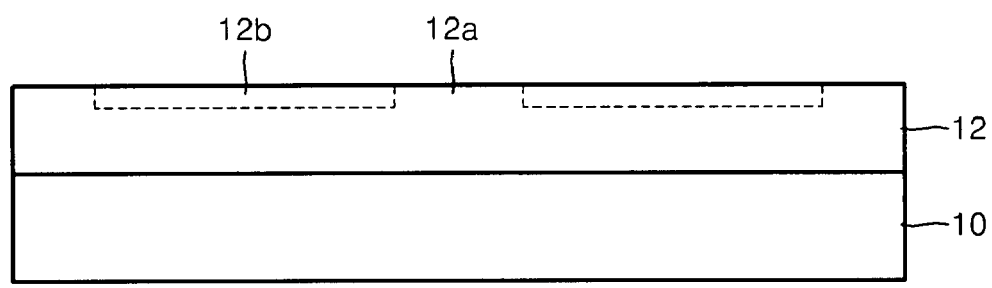

Referring to FIGS. 2B through 2D, the amorphous region 12b caused by a bombardment damage and the crystalloid region 12a that results from non-bombardment may be repeatedly and/or alternately formed on the first semiconductor layer 12 by applying ion bombardment to a portion of the surface of the first semiconductor layer 12.

Specifically, first, referring to FIG. 2B, a mask layer 100 in a pattern (such as a pattern or patterns of posts, a dot pattern or patterns, and/or a striped pattern or patterns) for partly exposing the top surface of the first semiconductor layer 12 may be formed on the first semiconductor layer 12. The mask layer 100 may be formed, for example, of photoresist, metal, or photoresist and metal.

Referring to FIG. 2C, the at least one amorphous region 12b caused by ion-bombardment damage is formed by applying ion bombardment to the exposed top surface of the first semiconductor layer 12 according to the pattern of the mask layer 100. The ion bombardment may include ions from one or more of B, P, As, Sb, BF$_2$, In, Ar, N, and Zn. And the ion bombardment may be performed at an absolute pressure of less than about $10^{-5}$ torr. In detail, the ions may be supplied by one or more of a radio frequency (RF)-ion source, a discharge-type ion source, a surface ionization source, and a hot electron source.

The thickness of the at least one amorphous region 12b may be greater than or equal to about 1 Å and less than or equal to about 5000 Å, and the width thereof may be greater than or equal to about 2 μm and less than or equal to about 30 μm. The at least one amorphous region 12b should be thick enough to function as a mask for suppressing crystal growth, but does not need to be thicker than about 5000 Å. For a similar reason, when the thickness of the at least one amorphous region 12b is too small, that is, is less than about 1 Å, the at least one amorphous region 12b may not function as the mask. As a result, the thickness of the at least one amorphous region 12b should be greater than or equal to about 1 Å.

Referring to FIG. 2D, the at least one crystalloid region 12a that results from non-bombardment may be exposed by removing the mask layer 100. The width of the at least one crystalloid region 12a may be greater than or equal to about 1 μm and less than or equal to about 20 μm. The width may be very suitable as a seed for crystal growth.

Figure 2E:
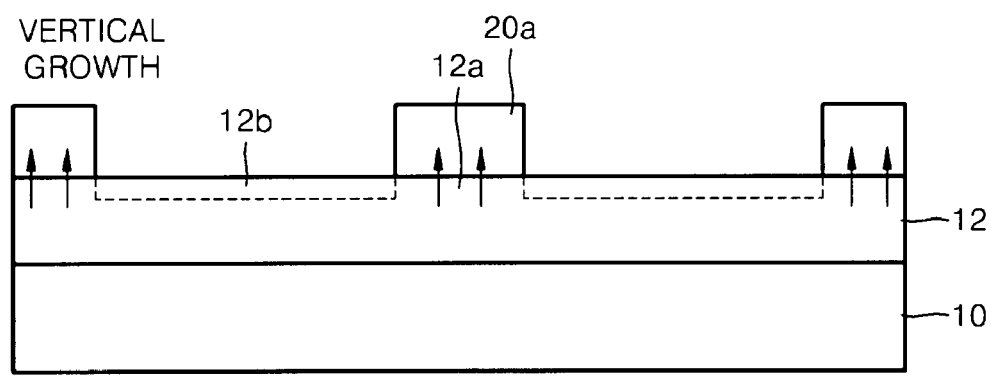
Figure 2F:
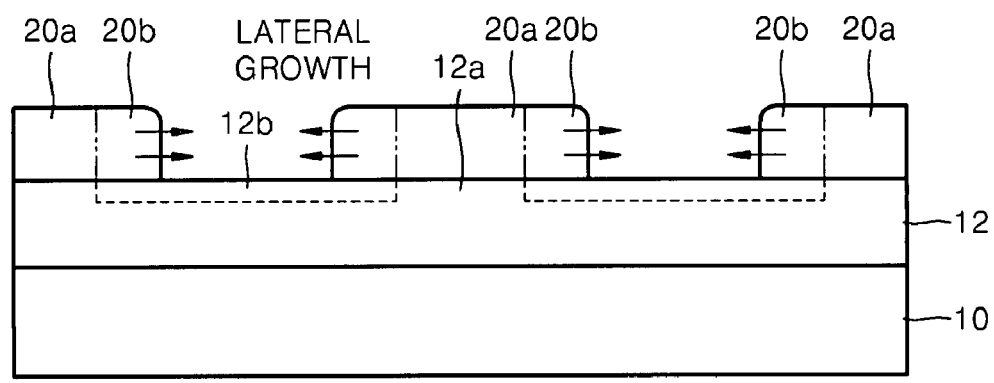
Figure 2G:
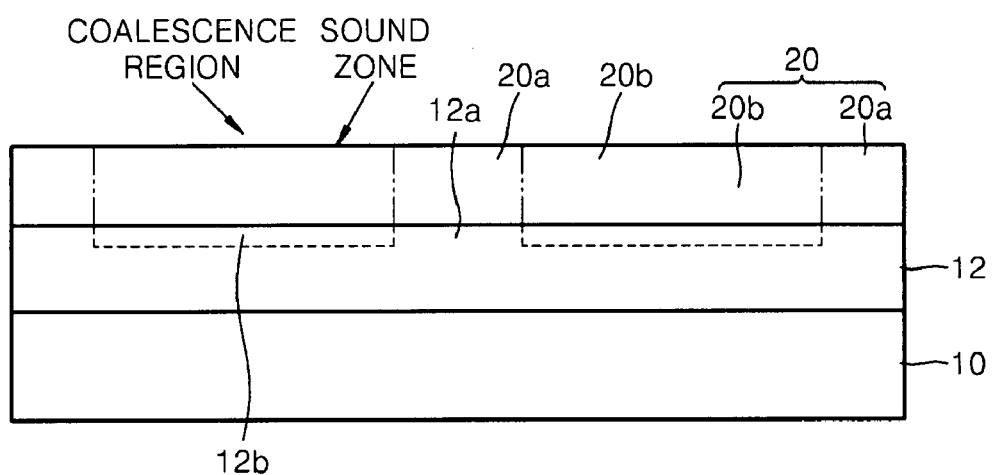

Referring to FIGS. 2E through 2G, the at least one crystalloid region 12a may be vertically, laterally, or vertically and laterally crystal-grown by, for example, metal organic chemical vapor deposition (MOCVD) using the at least one amorphous region 12b as a mask for suppressing crystal growth and using the at least one crystalloid region 12a as a seed for crystal growth, thereby forming a second semiconductor layer 20, that may have a lower defect density than that of the first semiconductor layer 12, on the first semiconductor layer 12. The second semiconductor layer 20 may include at least one vertical growth region 20a crystal-grown vertically from the at least one amorphous region 12b and at least one lateral growth region 20b crystal-grown laterally from the at least one vertical growth region 20a. A defect density of the second semiconductor layer 20 may be greater than or equal to about $10^4$ defects/cm$^2$ and less than or equal to about $10^7$ defects/cm$^2$. In detail, a defect density of the vertical growth region 20a may be greater than or equal to about $10^8$ defects/cm$^2$ and less than or equal to about $10^{10}$ defects/cm$^2$ and a defect density of the lateral growth region 20b may be greater than or equal to about $10^4$ defects/cm$^2$ and less than or equal to about $10^7$ defects/cm$^2$. In this case, the second semiconductor layer 20 may be formed of material having the same lattice parameter and thermal expansion coefficient as that of material used in forming the first semiconductor layer 12 (or material having a sufficiently small difference in lattice parameter and thermal expansion coefficient from that of material used in forming the first semiconductor layer 12) so that epitaxial growth can be easily performed. For example, the second semiconductor layer 20 may be formed of II-VI-group semiconductor material, III-V-group semiconductor material, or II-VI-group semiconductor material and III-V-group semiconductor material, that may be the same material or materials used in forming the first semiconductor layer 12.

In the current embodiment, the at least one amorphous region 12b and the at least one crystalloid region 12a may be formed in a striped pattern or patterns in or substantially in a <1-100> direction. As a result, the lateral growth of the at least one amorphous region 12b may be performed in or substantially in a <11-20> direction. In particular, GaN may show an excellent growth property in or substantially in the <11-20> direction.

FIGS. 3A through 3F illustrate a method of manufacturing a semiconductor substrate according to another example embodiment. Most processes of the current embodiment are similar to those of the example embodiments of FIGS. 2A through 2G. Thus, a description of repeated processes will be omitted and the current example embodiment will be described with reference to differences in the processes.

Figure 3A:
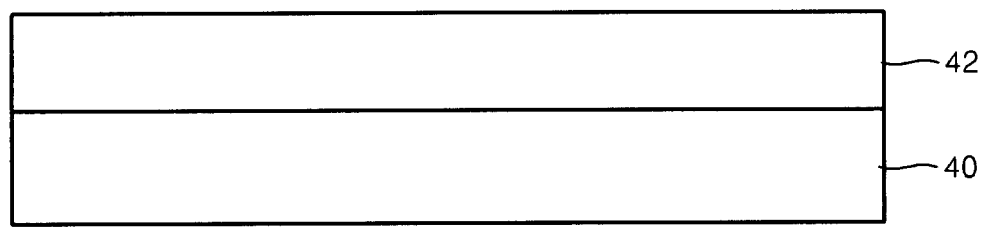
FIGS. 3A through 3F illustrate a method of manufacturing a semiconductor substrate according to another example embodiment.
Figure 3B:
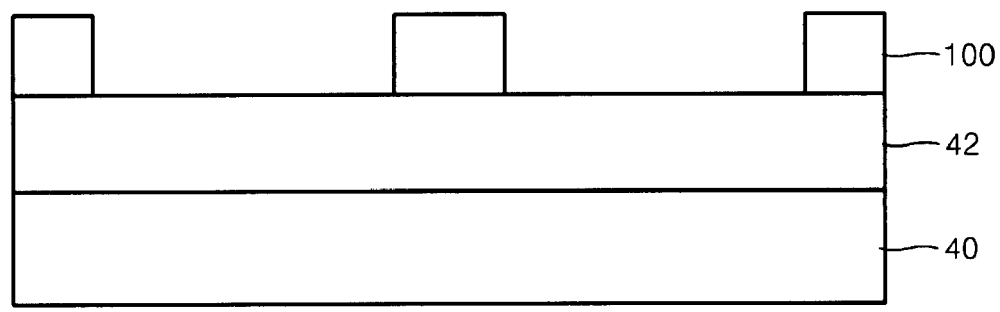

Referring to FIGS. 3A and 3B, a first semiconductor layer 42 may be crystal-grown on a growth substrate 40 using II-VI-group semiconductor material, III-V-group semiconductor material, or II-VI-group semiconductor material and III-V-group semiconductor material. Then, a mask layer 100 in a pattern (such as a pattern or patterns of posts, a dot pattern or patterns, and/or a striped pattern or patterns) for partly exposing the top surface of the first semiconductor layer 42 may be formed on the first semiconductor layer 42. These processes may be similar to those of the embodiment of FIGS. 2A and 2B.

Figure 3C:
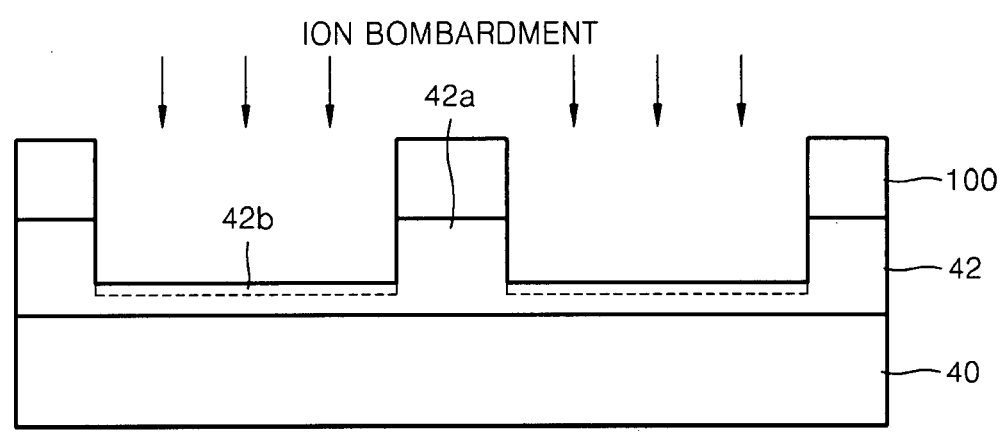

Referring to FIG. 3C, at least one amorphous region 42b caused by bombardment damage is formed by applying ion bombardment to the exposed top surface of the first semiconductor layer 42 according to the pattern of the mask layer 100. In this case, there is a difference between the current embodiment and the previous embodiment of FIGS. 2A through 2G in that a depth of greater than or equal to about 0.1 μm and less than or equal to about 4 μm is etched from the exposed top surface of the first semiconductor layer 42 by applying the ion bombardment and the at least one amorphous region 42b is formed in the first semiconductor layer 42 on the etched surface.

As in the previous embodiment of FIGS. 2A through 2G, the ion bombardment may include ions from one or more of B, P, As, Sb, BF$_2$, In, Ar, N, and Zn. And the ion bombardment may be performed at an absolute pressure of less than about $10^{-5}$ torr. In detail, the ions may be supplied by one or more of a radio frequency (RF)-ion source, a discharge-type ion source, a surface ionization source, and a hot electron source. In addition, the thickness of the at least one amorphous region 42b may be greater than or equal to about 1 Å and less than or equal to about 5000 Å, and the width thereof may be greater than or equal to about 2 μm and less than or equal to about 30 μm.

Figure 3D:
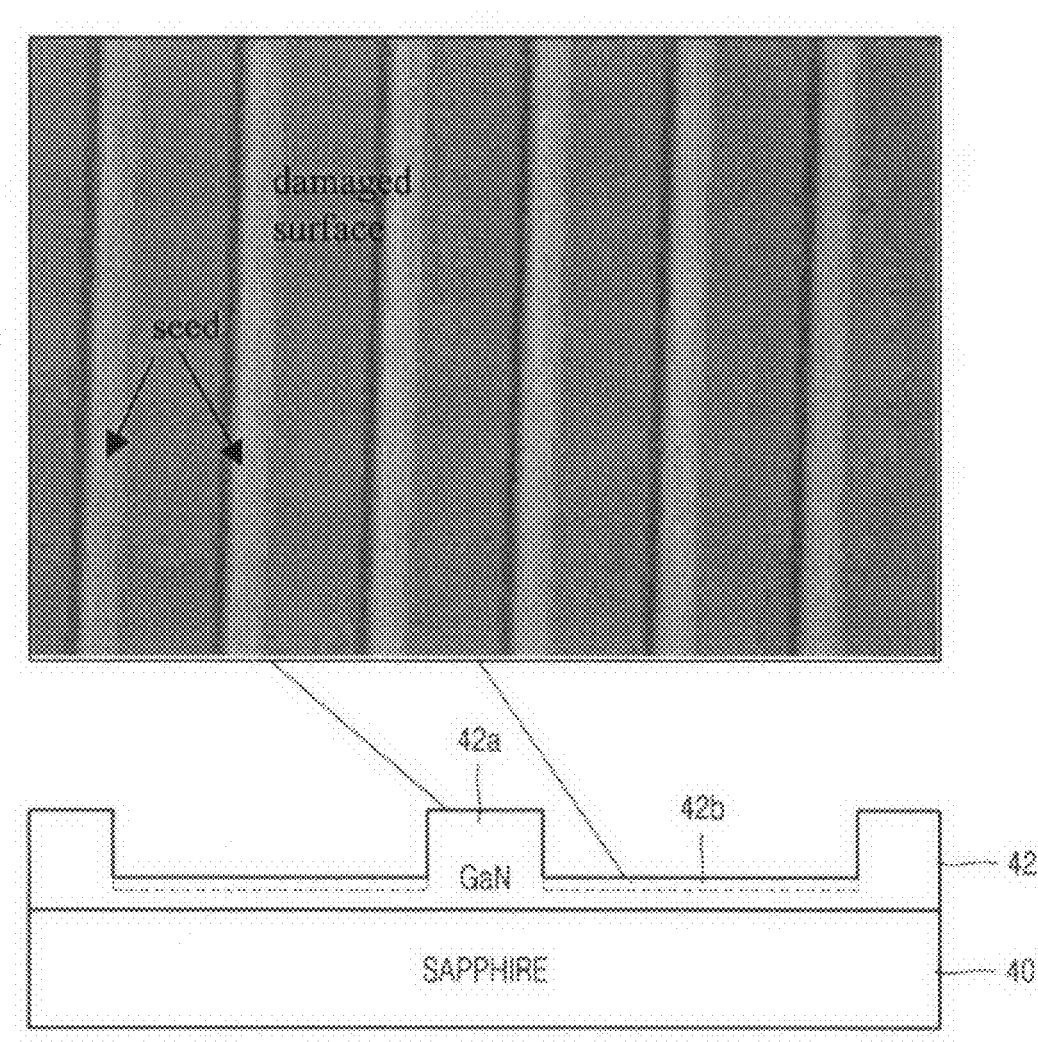

Referring to FIG. 3D, the at least one crystalloid region 42a that results from non-bombardment may be exposed by removing the mask layer 100. As a result of etching, the at least one crystalloid region 42a may have a three-dimensional (3D) shape, that is, a protruded shape. This protruded shape may be more advantageous to crystal growth to a lateral side. The width of the at least one crystalloid region 42a may be greater than or equal to about 1 μm and less than or equal to about 20 μm. A scanning electron microscopy (SEM) photo showing the surface of the first semiconductor layer 42 patterned by the etching is shown in FIG. 3D.

Figure 3E:
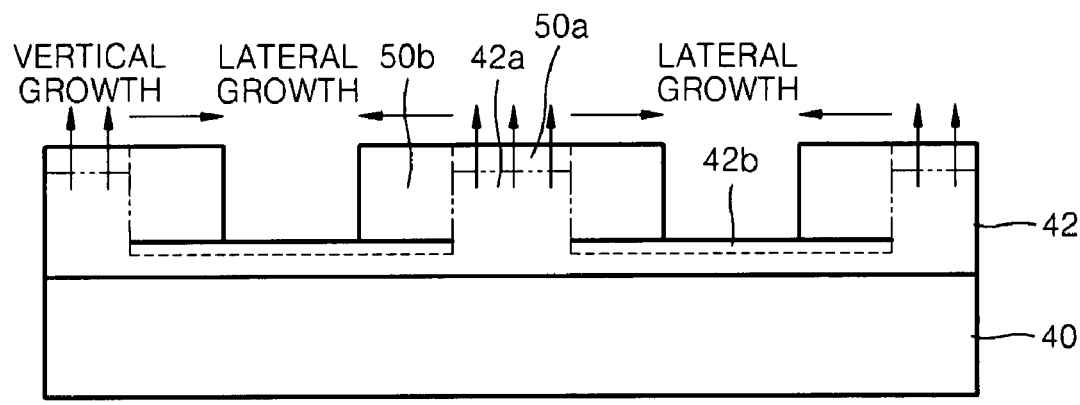
Figure 3F:
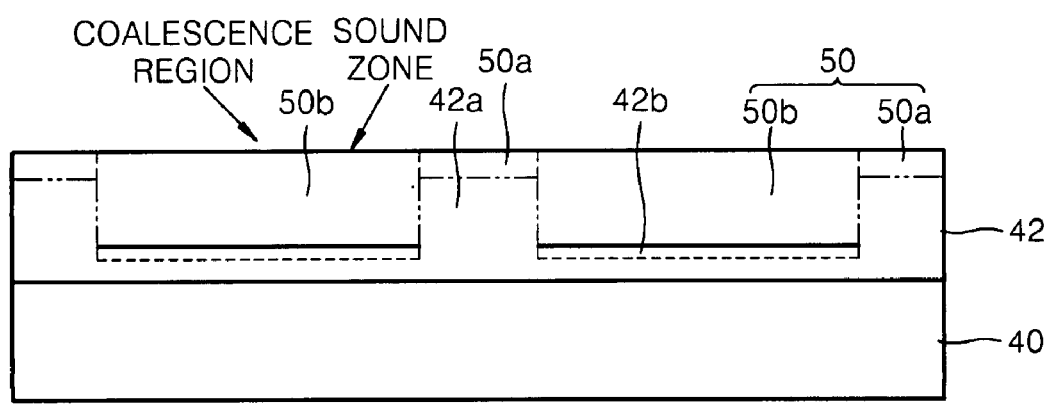

Referring to FIGS. 3E and 3F, the at least one crystalloid region 42a may be vertically, laterally, or vertically and laterally crystal-grown by, for example, metal organic chemical vapor deposition (MOCVD) using the at least one amorphous region 42b as a mask for suppressing crystal growth and using the at least one crystalloid region 42a as a seed for crystal growth, thereby forming a second semiconductor layer 50, having a lower defect density than that of the first semiconductor layer 42, on the first semiconductor layer 42. The second semiconductor layer 50 may include at least one vertical growth region 50a crystal-grown vertically from the at least one crystalloid region 42a and at least one lateral growth region 50b crystal-grown laterally from the at least one crystalloid region 42a. A defect density of the second semiconductor layer 50 may be greater than or equal to about $10^4$ defects/cm² and less than or equal to about $10^7$ defects/cm². In detail, a defect density of the at least one vertical growth region 50a may be greater than or equal to about $10^8$ defects/cm² and less than or equal to about $10^{10}$ defects/cm² and a defect density of the at least one lateral growth region 50b may be greater than or equal to about $10^4$ defects/cm² and less than or equal to about $10^7$ defects/cm².

Figure 4:
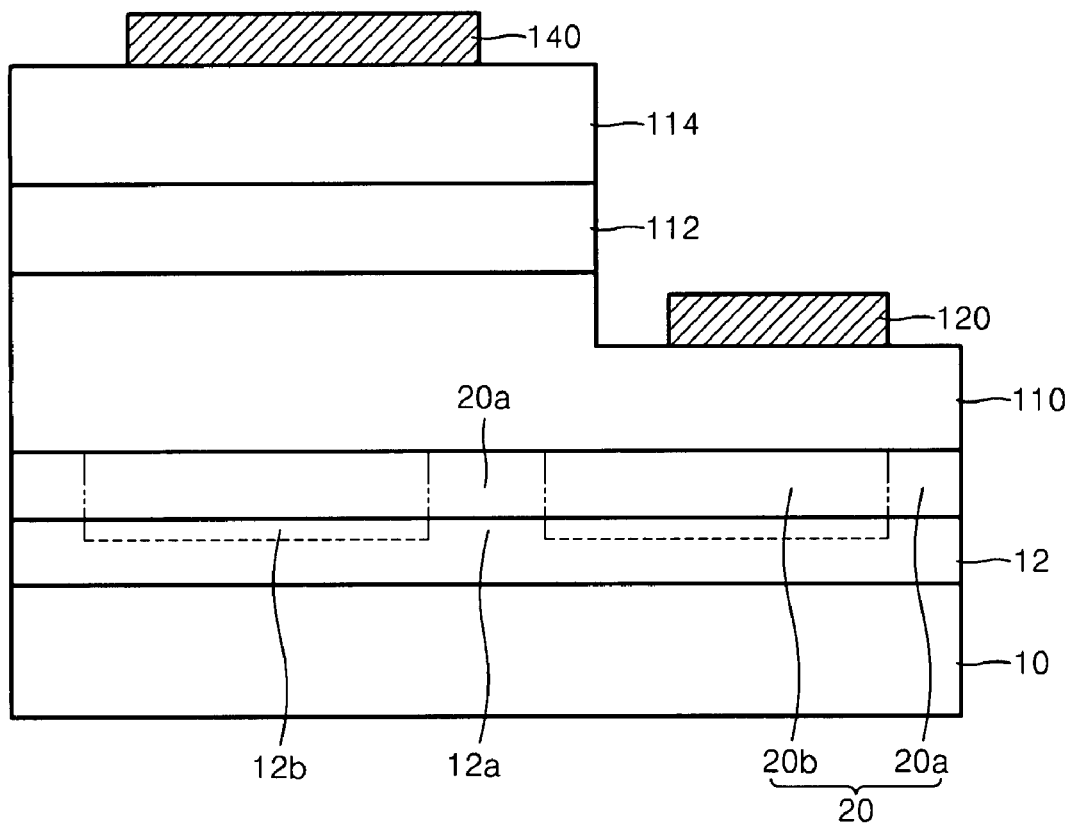
FIG. 4 is a schematic cross-sectional view of a light-emitting device according to an example embodiment.

FIG. 4 is a schematic cross-sectional view of a semiconductor light-emitting device according to an example embodiment. Referring to FIG. 4, the semiconductor light-emitting device may be characterized by including a semiconductor substrate manufactured according to FIGS. 2A through 2G and a semiconductor chip may be formed on the semiconductor substrate.

The semiconductor substrate may include a first semiconductor layer 12 and a second semiconductor layer 20 that may be sequentially formed on a growth substrate 10. The first semiconductor layer 12 may be formed of II-VI-group semiconductor material, III-V-group semiconductor material, or II-VI-group semiconductor material and III-V-group semiconductor material. The first semiconductor layer 12 may include an amorphous region 12b formed by ion-bombardment damage and a crystalloid region 12a that results from non-bombardment. In this case, the amorphous region 12b and the crystalloid region 12a may be repeatedly and/or alternately formed on the first semiconductor layer 12. The second semiconductor layer 20 may include at least one vertical growth region 20a crystal-grown vertically from the at least one crystalloid region 12a and at least one lateral growth region 20b crystal-grown laterally from the at least one vertical growth region 20a. Here, the structure of the semiconductor substrate manufactured according to FIGS. 2A through 2G and a method of manufacturing the same have been already described. Thus, a repeated description of the semiconductor substrate will be omitted and the structure of the semiconductor chip will be described.

The semiconductor chip may include an n-electrode 120, a p-electrode 140, an n-type semiconductor layer 110 disposed therebetween, an active layer 112, and/or a p-type semiconductor layer 114. In detail, the n-type semiconductor layer 110, the active layer 112, and/or the p-type semiconductor layer 114 may be sequentially stacked on the second semiconductor layer 20, and a portion of the uppermost surface of the p-type semiconductor layer 114 may be etched to about a depth of the n-type semiconductor layer 110 so that the n-type semiconductor layer 110 may be exposed. The n-electrode 120 may be formed on the exposed surface of the n-type semiconductor layer 110, and the p-electrode 140 may be formed on the uppermost surface of the p-type semiconductor layer 114. In a GaN-based semiconductor light-emitting device having the above structure, if a voltage is applied between the n-electrode 120 and the p-electrode 140, electrons and holes may be injected into the active layer 112 from the n-type semiconductor layer 110 and the p-type semiconductor layer 114, respectively, and the electrons and the holes may coalesce within the active layer 112 so that light can be emitted from the active layer 112.

According to example embodiments, since the second semiconductor layer 20 may have a low defect density, greater than or equal to about $10^4$ defects/cm² and less than or equal to about $10^7$ defects/cm², and an excellent surface morphology property, the optical output property of the light-emitting device implemented on the second semiconductor layer 20 may be improved and the thermal reliability of the light-emitting device may be improved so that the life time of the light-emitting device may be increased.

The n-type semiconductor layer 110 may be formed of an AlInGaN-based III-V-group nitride semiconductor material, for example, an n-GaN layer. The active layer 112 may be a GaN-based III-V-group nitride semiconductor layer that is $In_xAl_yGa_{1-x-y}N$ ($0 \leq x \leq 1$, $0 \leq y \leq 1$ and $0 \leq x+y \leq 1$), for example, an InGaN layer or an AlGaN layer. Here, the active layer 112 may be formed, for example, of multi-quantum well (hereinafter, referred to as 'MQW') structure and/or single quantum well structure. One of ordinary skill in the art may envision other structures for the active layer 112. For example, the active layer 112 may be formed of a GaN/InGaN/GaN MQW or GaN/AlGaN/GaN MQW structure. And the p-type semiconductor layer 114 may be a p-GaN-based III-V-group nitride semiconductor layer, for example, a p-GaN layer or a p-GaN/AlGaN layer.

The n-electrode 120 and the p-electrode 140 may be formed of conductive material, for example, metal(s) such as Au, Al, or Ag, or transparent conductive oxide. The transparent conductive oxide may include one or more of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, and $Zn_{1-x}Mg_xO$(Zinc Magnesium Oxide, $0 \leq x \leq 1$). Examples include $Zn_2In_2O_5$, $GaInO_3$, $ZnSnO_3$, F-doped $SnO_2$, Al-doped ZnO, Ga-doped ZnO, MgO, and ZnO.

Figure 5A:
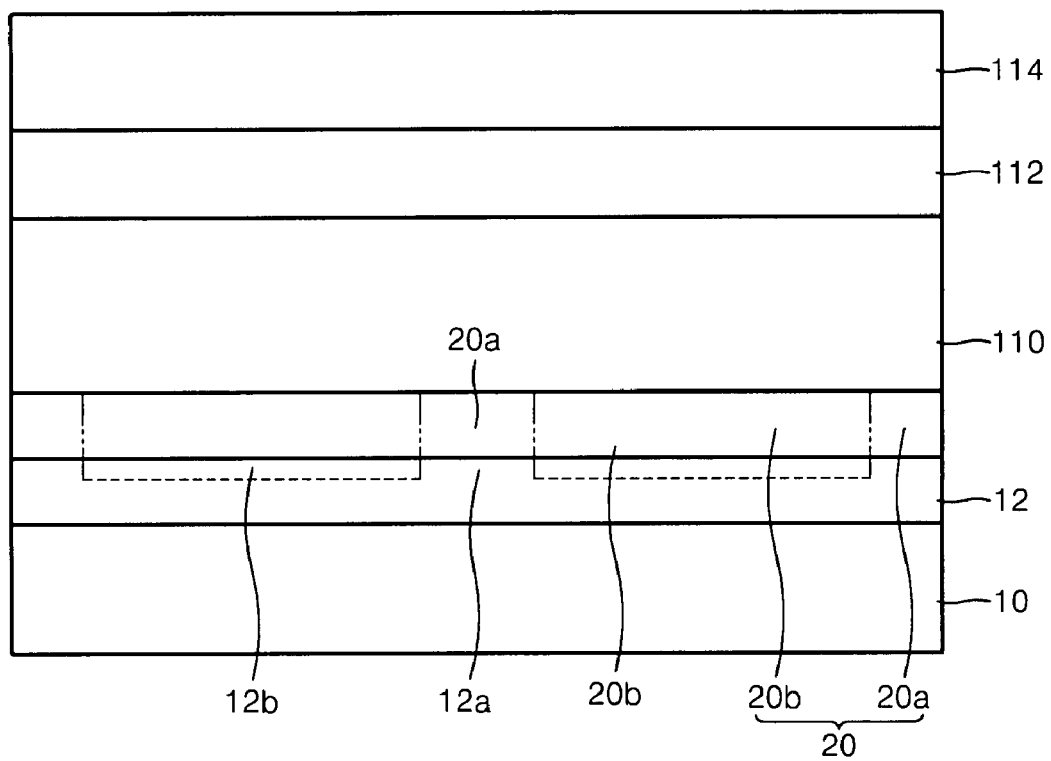
FIGS. 5A through 5C illustrate a method of manufacturing a light-emitting device according to an example embodiment.
Figure 5B:
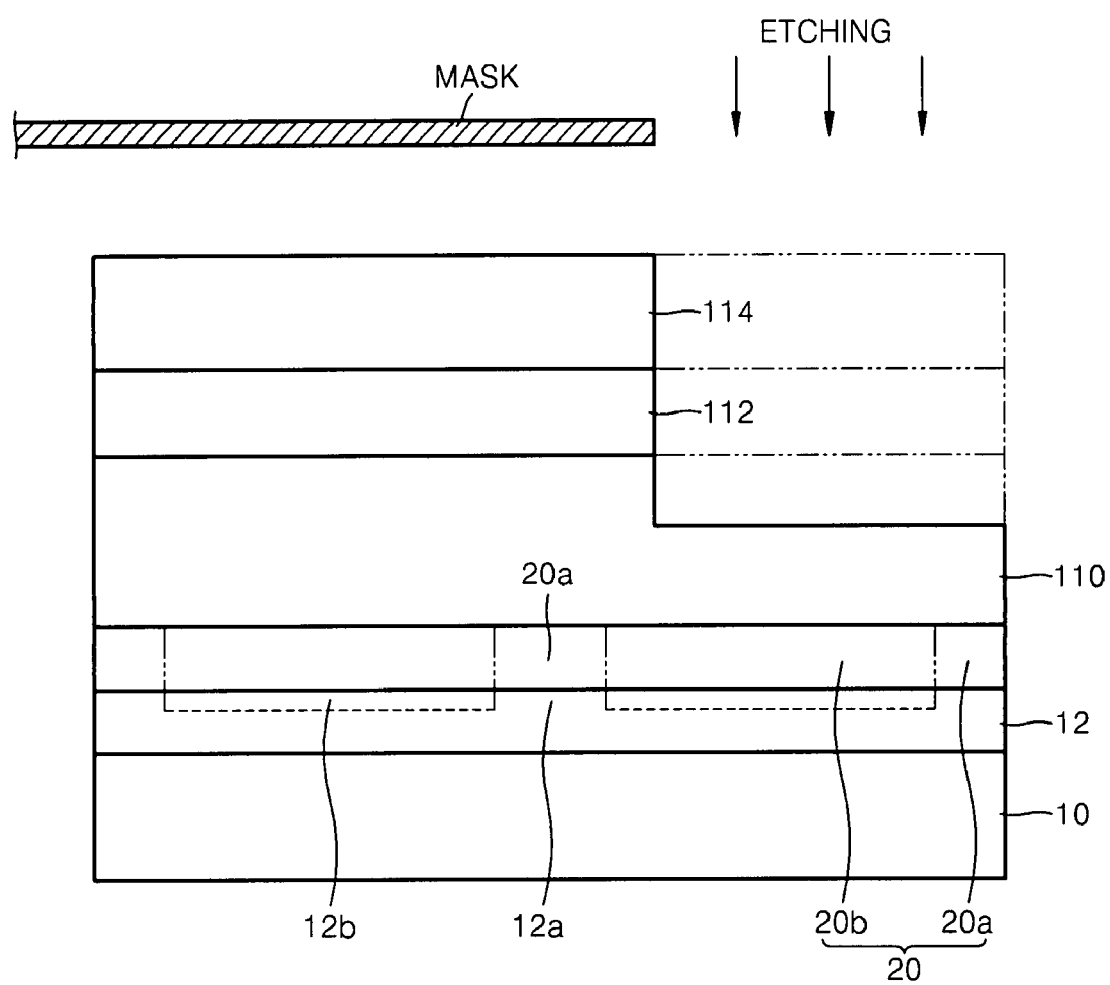
Figure 5C:
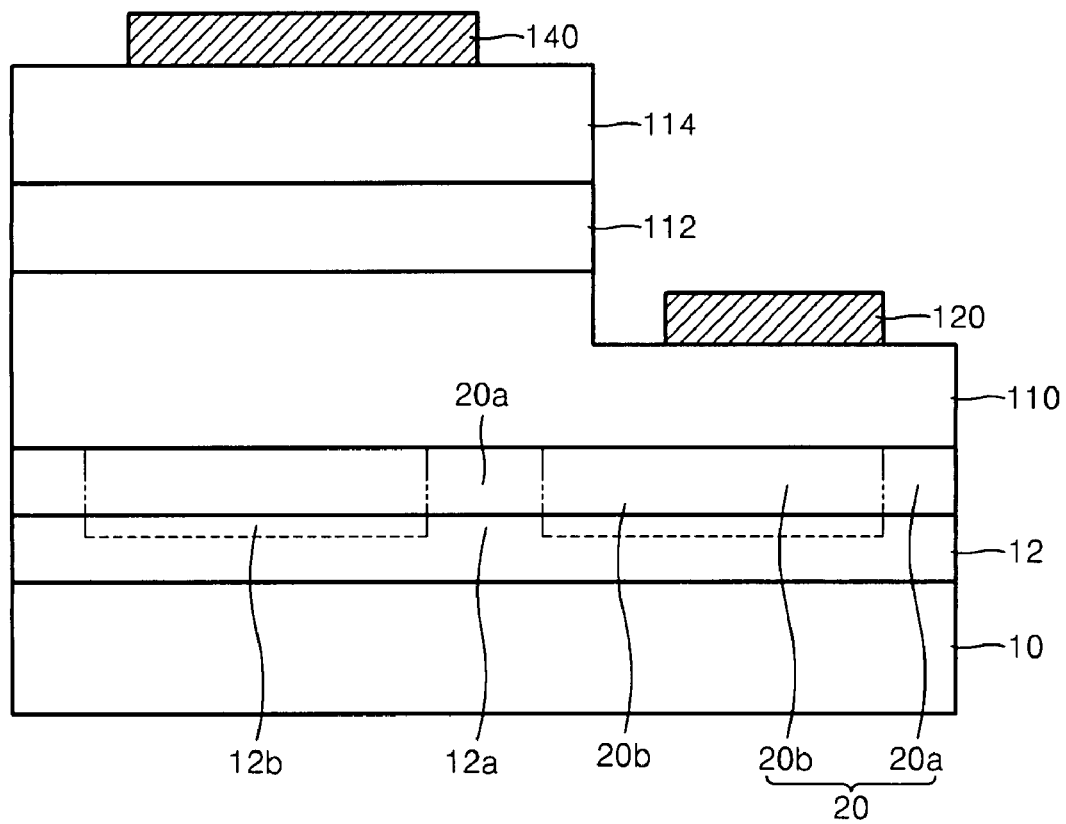

FIGS. 5A through 5C illustrate a method of manufacturing a semiconductor light-emitting device according to an example embodiment. Methods of manufacturing semiconductor substrates illustrated in FIGS. 2A through 2G have been already described. Thus, a repeated description of the semiconductor substrate will be omitted and a method of manufacturing a semiconductor chip will be described. Here, each material layer may be formed by halide or hydride vapor phase epitaxy (HVPE), metal organic chemical vapor deposition (MOCVD), molecular beam epitaxy (MBE), plasma enhanced chemical vapor deposition (PECVD), and/or vapor deposition, such as sputtering and/or evaporation. These methods are well-known and, thus, a detailed description thereof will be omitted.

Referring to FIG. 5A, after a semiconductor substrate may be manufactured according to FIGS. 2A through 2G, a n-type semiconductor layer 110, an active layer 112, and/or a p-type semiconductor layer 114 may be sequentially formed on the semiconductor substrate.

Specifically, after a growth substrate 10 suitable for lattice matching for the growth of a II-VI-group semiconductor layer and/or a III-V-group semiconductor layer is prepared, a first semiconductor layer 12 is crystal-grown on the growth substrate 10 using II-VI-group semiconductor material, III-VI-group semiconductor material, or II-VI-group semiconductor material and III-V-group semiconductor material. Then, an amorphous region 12b caused by a bombardment damage and a crystalloid region 12a that results from non-bombardment may be repeatedly and/or alternately formed on the first semiconductor layer 12 by partly applying ion bombardment to the surface of the first semiconductor layer 12. Next, the at least one crystalloid region 12a may be vertically, laterally, or vertically and laterally crystal-grown by, for example, metal organic chemical vapor deposition (MOCVD) using the at least one amorphous region 12b as a mask for suppressing crystal growth and using the at least one crystalloid region 12a as a seed for crystal growth, thereby forming a second semiconductor layer 20, having a lower defect density than that of the first semiconductor layer 12, on the first semiconductor layer 12.

Next, the n-type semiconductor layer 110, the active layer 112, and/or the p-type semiconductor layer 114 may be sequentially formed on the second semiconductor layer 20. The n-type semiconductor layer 110 may be formed of an AlInGaN-based III-V-group nitride semiconductor material, for example, an n-GaN layer. The active layer 112 may be a GaN-based III-V-group nitride semiconductor layer that is $In_xAl_yGa_{1-x-y}N$ ($0 \leq x \leq 1$, $0 \leq y \leq 1$, and $0 \leq x+y \leq 1$), for example, an InGaN layer and/or an AlGaN layer. Here, the active layer 112 may be formed, for example, of MQW structure and/or single quantum well structure. One of ordinary skill in the art may envision other structures for the active layer 112. For example, the active layer 112 may be formed of a GaN/InGaN/GaN MQW and/or GaN/AlGaN/GaN MQW structure. And, the p-type semiconductor layer 114 may be a p-GaN-based III-V-group nitride semiconductor layer, for example, a p-GaN layer or a p-GaN/AlGaN layer.

Referring to FIGS. 5B and 5C, a region of a top surface of the p-type semiconductor layer 114 may be etched to about a depth of the n-type semiconductor layer 110, thereby forming an etched surface in the n-type semiconductor layer 110. Then, an n-electrode 120 and a p-electrode 140 may be formed using conductive material, for example, metal(s) such as Au, Al, or Ag, or a transparent conductive oxide, on the etched surface of the n-type semiconductor layer 110 and on the p-type semiconductor layer 114.

According to example embodiments, a low-defect semiconductor substrate having a low defect density, greater than or equal to about $10^4$ defects/cm$^2$ and less than or equal to about $10^7$ defects/cm$^2$, and having an excellent surface morphology property may be manufactured by a simple and easy process. The semiconductor substrate may be used as a substrate for manufacturing optoelectronic devices such as GaN-based light-emitting diodes (LED) or laser diodes (LD) such that the life time and/or reliability of the optoelectronic devices are improved.

While example embodiments have been particularly shown and described, it will be understood by those of ordinary skill in the art that various changes in form and details may be made therein without departing from the spirit and scope of the present invention as defined by the following claims.

What is claimed is:

1. A method of manufacturing a semiconductor substrate, the method comprising:
   preparing a growth substrate;
   crystal-growing a first semiconductor layer on the growth substrate using II-VI-group semiconductor material, III-V-group semiconductor material, or II-VI-group semiconductor material and III-V-group semiconductor material;
   forming a plurality of amorphous regions in a top surface of the first semiconductor layer, the plurality of amorphous regions being surrounded by a crystalloid region of the first semiconductor layer in order to expose a top surface of the plurality of amorphous regions; and
   forming a second semiconductor layer on the first semiconductor layer using the plurality of amorphous regions as a mask to suppress crystal growth of the second semiconductor layer from the plurality of amorphous regions of the first semiconductor layer and the crystalloid region as a seed to support crystal growth of the second semiconductor layer from the crystalloid region of the first semiconductor layer;
   wherein the second semiconductor layer has a lower defect density than the first semiconductor layer,
   wherein forming the plurality of the amorphous regions includes,
      forming a mask layer on the first semiconductor layer, the mask layer including one or more patterns,
      etching an exposed top surface of the first semiconductor layer according to the mask layer by applying ion bombardment, the exposed top surface of the first semiconductor layer being the plurality of the amorphous regions, and
      removing the mask layer, and
   wherein the ion bombardment includes ions from one or more of boron (B), phosphorus (P), arsenic (As), antimony (Sb), boron fluoride (BF$_2$), indium (In) and zinc (Zn).

2. The method of claim 1, wherein the second semiconductor layer is formed using metal organic chemical vapor deposition (MOCVD).

3. The method of claim 1, wherein the mask layer is a photoresist layer or a metal layer.

4. The method of claim 1, wherein the mask layer is a striped pattern that is formed substantially in a <1-100> direction.

5. The method of claim 1, wherein etching the exposed top surface comprises:
   etching the exposed top surface of the first semiconductor layer to a depth of greater than or equal to about 0.1 µm and less than or equal to about 4 µm.

6. The method of claim 1, wherein the growth substrate comprises one or more of sapphire, 6H—SiC, MgAl$_2$O$_3$, Si(111), and ZnO.

7. The method of claim 1, wherein the III-V-group semiconductor material comprises one or more of GaN, GaAs, and InP.

8. The method of claim 1, wherein the ion bombardment is performed at an absolute pressure of less than about $10^{-5}$ torr.

9. The method of claim 1, wherein ions for the ion bombardment are supplied by one or more of a radio frequency (RF)-ion source, a discharge-type ion source, a surface-ionization source, and a hot electron source.

10. The method of claim 1, wherein a thickness of the first semiconductor layer is greater than or equal to about 1 μm and less than or equal to about 5 μm.

11. The method of claim 1, wherein a width of each of the plurality of amorphous regions is greater than or equal to about 2 μm and less than or equal to about 30 μm.

12. The method of claim 1, wherein a thickness of each of the plurality of amorphous regions is greater than or equal to about 1 Angstrom and less than or equal to about 5000 Angstroms.

13. The method of claim 1, wherein a width of the crystalloid region between two neighboring amorphous regions is greater than or equal to about 1 μm and less than or equal to about 20 μm.

14. The method of claim 1, wherein the plurality of amorphous regions and the crystalloid region are formed in a striped.

15. The method of claim 14, wherein the striped pattern is formed substantially in a <1-100> direction.

16. The method of claim 1, wherein the second semiconductor layer is formed by growing the crystalloid region substantially in a <11-20> direction.

17. The method of claim 1, wherein a defect density of the first semiconductor layer is greater than or equal to about $10^8$ defects/cm$^2$ and less than or equal to about $10^{10}$ defects/cm$^2$.

18. The method of claim 1, wherein the second semiconductor layer includes a defect density greater than or equal to about $10^4$ defects/cm$^2$ and less than or equal to about $10^7$ defects/cm$^2$.

19. The method of claim 1, wherein the first semiconductor layer and the second semiconductor layer are formed of one or more nitride semiconductors.

20. A method of manufacturing a semiconductor light-emitting device, the method comprising:
   manufacturing a semiconductor substrate according to the method of claim 1; and
sequentially forming an n-type semiconductor layer, an active layer, and a p-type semiconductor layer on the second semiconductor layer.

* * * * *